US007994818B2

(12) United States Patent
Lee et al.

(10) Patent No.: US 7,994,818 B2
(45) Date of Patent: Aug. 9, 2011

(54) PROGRAMMABLE INTERCONNECT NETWORK FOR LOGIC ARRAY

(75) Inventors: Fungfung Lee, Beijing (CN); Wen Zhou, Beijing (CN)

(73) Assignee: Agate Logic (Beijing), Inc., Beijing (CN)

( * ) Notice: Subject to any disclaimer, the term of this patent is extended or adjusted under 35 U.S.C. 154(b) by 0 days.

(21) Appl. No.: 12/601,321

(22) PCT Filed: Jun. 20, 2007

(86) PCT No.: PCT/CN2007/001939
§ 371 (c)(1),
(2), (4) Date: Nov. 23, 2009

(87) PCT Pub. No.: WO2008/154775
PCT Pub. Date: Dec. 24, 2008

(65) Prior Publication Data
US 2010/0171524 A1 Jul. 8, 2010

(51) Int. Cl.
*H03K 19/173* (2006.01)
(52) U.S. Cl. ............................................ 326/41; 326/38
(58) Field of Classification Search .............. 326/38–41,
326/47; 716/11, 2, 7, 9
See application file for complete search history.

(56) References Cited

U.S. PATENT DOCUMENTS

| 5,519,629 | A | * | 5/1996 | Snider | 716/17 |
|---|---|---|---|---|---|
| 5,924,115 | A | | 7/1999 | Von Herzen et al. | |
| 6,301,694 | B1 | * | 10/2001 | Lee et al. | 716/11 |
| 6,828,824 | B2 | * | 12/2004 | Betz et al. | 326/47 |
| 6,940,308 | B2 | * | 9/2005 | Wong | 326/41 |
| 7,928,764 | B2 | * | 4/2011 | Yu et al. | 326/41 |
| 2001/0038298 | A1 | | 11/2001 | Marshall et al. | |
| 2007/0165547 | A1 | | 7/2007 | Lindwer et al. | |
| 2009/0261858 | A1 | * | 10/2009 | Yu et al. | 326/38 |
| 2009/0289661 | A1 | * | 11/2009 | Lee et al. | 326/41 |

FOREIGN PATENT DOCUMENTS

WO    WO 2005/024644    3/2005

OTHER PUBLICATIONS

International Search Report (PCT/ISA/210) dated Mar. 14, 2008 from PCT/CN2007/001939.
Written Opinion (PCT/ISA/237) dated Mar. 27, 2008 from PCT/CN2007/001939.

* cited by examiner

*Primary Examiner* — Vibol Tan
(74) *Attorney, Agent, or Firm* — Buchanan Ingersoll Rooney PC

(57) ABSTRACT

The present invention provides an integrated circuit, comprising an array of components and programmable interconnect network for the array of components, said programmable interconnect network comprising a plurality of switch boxes being connected in a tree-based hierarchical architecture and providing selection and connection for the components responsive to configuration bits, switch boxes located at the lowest level of hierarchy are connected to the components; switch boxes in at least one level of hierarchy have different number of children from those in other levels of hierarchy. The present invention provides a hierarchical architecture with a vast variety of cell numbers, which facilitates circuit implementation. The present invention also offers greater layout flexibility.

12 Claims, 8 Drawing Sheets

PROGRAMMABLE INTERCONNECT NETWORK FOR LOGIC ARRAY

TECHNICAL FIELD

This invention relates to an integrated circuit interconnection and, more specifically, a programmable interconnect network of integrated circuits such as FPGA (Field Programmable Gate Array).

BACKGROUND OF THE INVENTION

FPGA is an integrated circuit whose functionalities are designated by the users of the FPGA. The user programs the FPGA to perform the functions desired by the user. FPGA comprises logic cells, which perform the functions of the FPGA, and interconnection network between the logic cells. A prior art interconnection network is of a tree-based hierarchical architecture, in which interconnections of tree structure are used to make connections between logic cells of row-column layout. Heretofore, this interconnection network has been implemented as a quad-tree network, i.e. a switch box of upper level of hierarchy connecting to 4 logic cells or switch boxes of lower level of hierarchy, resulting in a circuit with number of logic cells amounting to power of 4. For example, FPGA would have 1024, 4096, and 16384 logic cells with respect to level number of hierarchy of 5, 6 and 7. Apparently, there exist some applications, which may need for example 1500 logic cells but have to be implemented in FPGA with 4096 logic cells. That is to say, only a small part of logic cells could be utilized in this circuit. Currently, Integrated Circuits have vast applications in various fields. In certain circumstances, the number of logic cells as demanded is not always a power of 4 or close to. Building such an IC by quad-tree interconnect network would inevitably lead to non-effective use of chip area.

Furthermore, the integrated circuit with quad-tree hierarchical interconnection architecture will inevitably have an approximately square layout. In case of a so-called System-on-a-Chip (SOC), which usually has a square layout and contains several integrated circuits, it has been proved difficult to place such integrated circuits on the chip.

SUMMARY OF THE INVENTION

Therefore, it is an object of the present invention to provide a new interconnect architecture, which overcomes any of the above mentioned problems.

The present invention provides an integrated circuit, comprising an array of components and programmable interconnect network for the array of components, said programmable interconnect network comprising a plurality of switch boxes being connected in a tree-based hierarchical architecture and providing selection and connection for the components responsive to configuration bits, switch boxes located at the lowest level of hierarchy are connected to the components; switch boxes in at least one level of hierarchy have different number of children from those in other levels of hierarchy.

Preferably, said plurality of switch boxes comprise multiplexers, pass transistors, or pass gates.

Preferably, children number is chosen from the group including 4, 6 and 8.

Preferably, said integrated circuit comprises an FPGA, and said component is logic cell.

Preferably, said integrated circuit comprises a SOC.

The present invention provides a hierarchical architecture with a vast variety of cell numbers, which facilitates circuit implementation. The present invention also offers greater layout flexibility.

The above and other objects, features, and advantages of the present invention will become apparent from the following detailed description thereof, which is described with reference to the accompanying drawings in which the like reference numerals represent the same or similar elements.

DETAILED DESCRIPTION OF THE PREFERRED EMBODIMENTS

Figure 1:
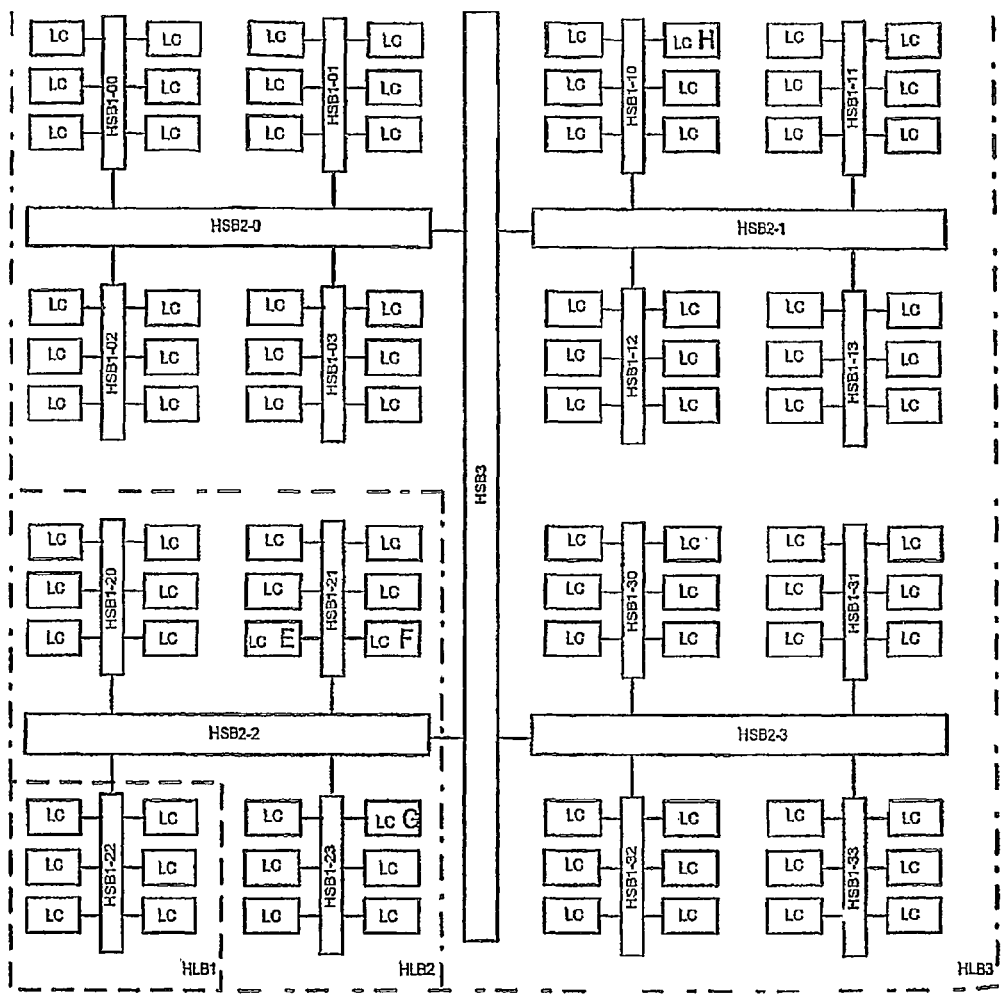
FIG. 1 illustrates a tree based hierarchical architecture of programmable interconnect network for FP logic cells according to an embodiment of the present invention.

FIG. 1 illustrates a tree based hierarchical architecture of programmable interconnect network for FP logic cells according to an embodiment of the present invention. As shown in FIG. 1, an 8*12 logic cell array consisting of 96 logic cells (LC) is provided. The LCs are interconnected by a programmable interconnect network, which is formed by a 3-level mixed tree hierarchical architecture of hierarchical switch boxes (HSBs). The HSBs are configurable, responsive to configuration bits, to implement programmable routing paths to all the LCs. Word "mixed" means that in this architecture, numbers of HSBs or LCs are different in some levels of hierarchy from other levels of hierarchy. More specifically, in the 3-level mixed tree hierarchical architecture of switch boxes, six neighboring LCs are connected respectively to one hierarchical switch box (HSB) in level L1, i.e. $HSB_1$. Four neighboring HSBs in L1 are connected to one HSB in level L2, i.e. $HSB_2$. Four neighboring HSBs in level L2 are connected to one HSB in level L3, i.e. $HSB_3$. For clarity, HSBs in lower level of hierarchy are referred to as children HSBs, and HSBs in higher level of hierarchy, which are connected to the children HSBs, are referred to as parent HSBs.

For better illustration, a logic block formed by a HSB1 and six LCs connected by the $HSB_1$ is referred to as Hierarchical Logic Block in level 1 ($HLB_1$). A logic block formed by a HSB2 and four HLBs in L1 connected thereby are referred to as $HLB_2$. The whole block, which is formed by $HSB_3$ and the four HSBs in L2, is referred to as $HLB_3$. The $HLB_1$ in left-bottom corner, the $HLB_2$ in left-bottom corner, and the $HLB_3$ are outlined by dotted lines. Again, HLBs in lower level of hierarchy are referred to as children HLBs, and HLB in higher level of hierarchy, which is formed by the children HLBs, is referred to as parent HLB.

From FIG. 1, it is noted that each $HLB_1$ contains $6HLB_0$ (=LC: Logic Cell), each $HLB_2$ contains 4 $HLB_1$, and the only one $HLB_3$ contains 4 $HLB_2$. In other words, each $HLB_1$ has 6 children, each $HLB_2$ has 4 children, and $HLB_3$ has 4 children.

To facilitate illustration, the HSBs in the figure are labeled with additional numbers. Since there is only one HSB in L3 level of hierarchy, and thus no further labeling for this $HSB_3$. In L2 level of hierarchy, a HSB is labeled as $HSB_2$-M, where M is a position index and may have a value selected from 0, 1, 2 and 3, depending on the position of the HSB relative to the other three HSBs in L2. For example, the position index "0" represents the top left corner, "1" represents the top right corner, "2" represents the bottom left corner, and "3" represents the bottom right corner. In L1 level of hierarchy, a HSB is labeled as $HSB_1$-MN, where M represents the position index of $HSB_2$ to which the HSB is connected, i.e., the number of its parent, and N represents the position index of the HSB relative to the other three HSBs belonging to the same $HSB_2$ (parent HSB in L2) and may have a value from 0, 1, 2, and 3.

By means of the interconnect network formed by the HSBs, an LC of the array may be connected to any other LC in the array. For example, an LC labeled as E (LC E) is connectable to $HSB_1$-21 of L1, and then to an LC labeled as F (LC F). In another example, to connect the LC E to LC G, the routing path includes $HSB_1$-21, $HSB_2$-2, and $HSB_1$-23. In a third example, when connecting from LC E to LC H, the routing path includes $HSB_1$-21, $HSB_2$-2, $HSB_3$, $HSB_2$-1 and $HSB_1$-10.

Note that FIG. 1 has a rectangular shape, longer in up-down direction and shorter in left-right direction because 6 LCs, instead of 4 LCs, have been deposited in up-down direction. This offers flexibility for layout of integrated circuits in one chip.

Figure 2:
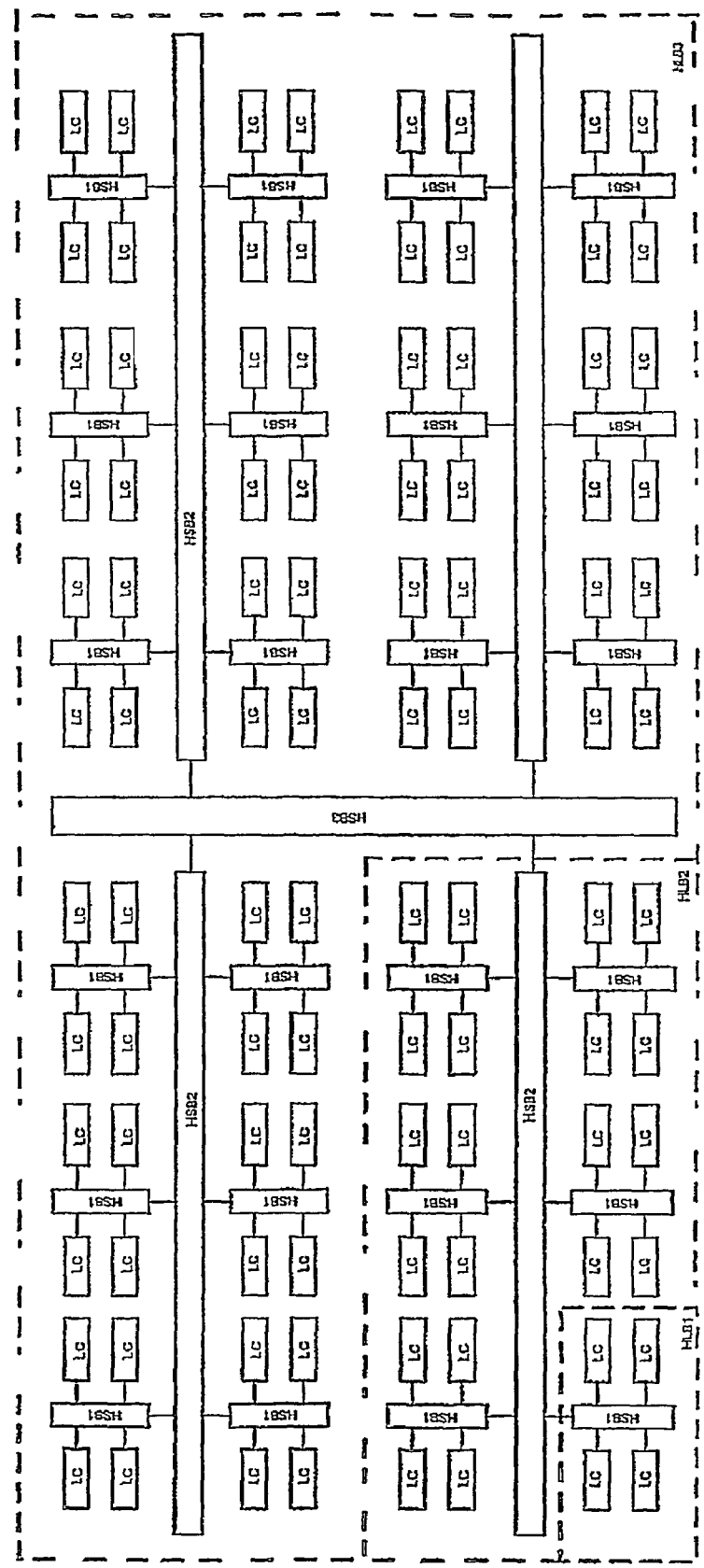
FIG. 2 illustrates a tree based hierarchical architecture of programmable interconnect network for FP logic cells according to another embodiment of the present invention.

In FIG. 1, the different number of children, 6, is located in the lowest level, L1. However, it may be located in other levels. FIG. 2 shows a 3-level tree based interconnect network for 8×12 LC array, in which each $HLB_1$ has 4 children, each $HLB_2$ has 6 children, and $HLB_3$ has 4 children.

Although 3-level tree based interconnect networks for 8×12 LC array have been described in conjunction with FIG. 1 and FIG. 2, interconnect network having more than 3 levels may be adopted according to the present invention.

Figure 3:
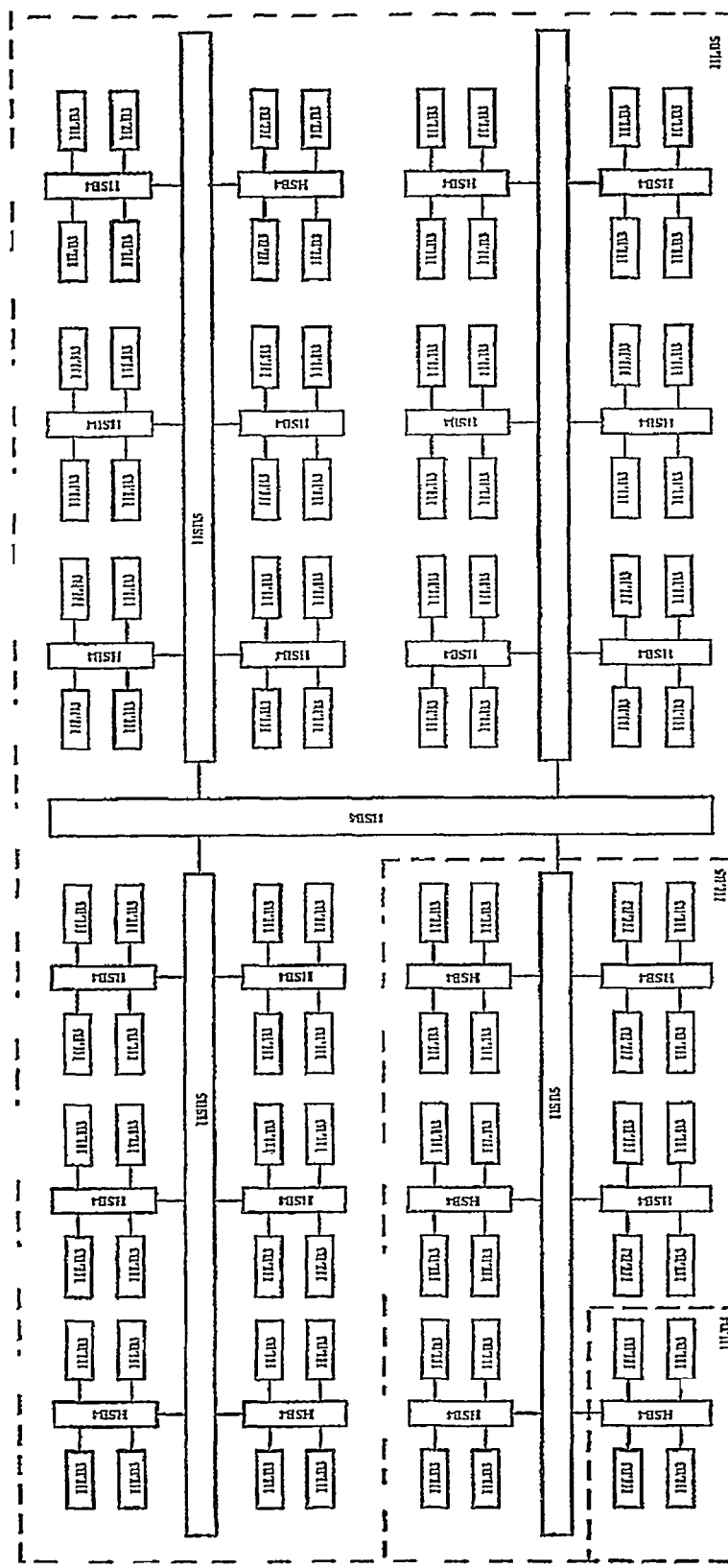
FIG. 3 illustrates a 6-level tree based programmable interconnect network according to another embodiment of the present invention.

FIG. 3 illustrates a 6-level tree based programmable interconnect network according to another embodiment of the present invention. In FIG. 3, each HLB3 may represent the entire logic block of FIG. 1 or FIG. 2. Four neighboring HLBs in L3 are connected to one HSB in level L4, i.e. $HSB_4$. Six neighboring HLBs in L4 are connected to one HSB in level L5, i.e. $HSB_5$. Four neighboring HLBs in level L5 are connected to one HSB in level L6, i.e. $HSB_6$. The $HLB_4$ in left-bottom corner, the $HLB_5$ in left-bottom corner, and the $HLB_6$ are outlined by dotted lines.

In other words, each HLB4 contains 4 children ($HLB_3$s), each $HLB_5$ contains 6 children ($HLB_4$s), and the only one $HLB_6$ contains 4 children ($HLB_5$s).

It should be understood that, although the hierarchical architectures in FIG. 3 have only one level of different number of children, the present invention should not be limited thereto. For example, the hierarchical architectures according to the present invention may have more than 2 different numbers of children and/or each different number may be located in more than one level of hierarchy.

Figure 4:
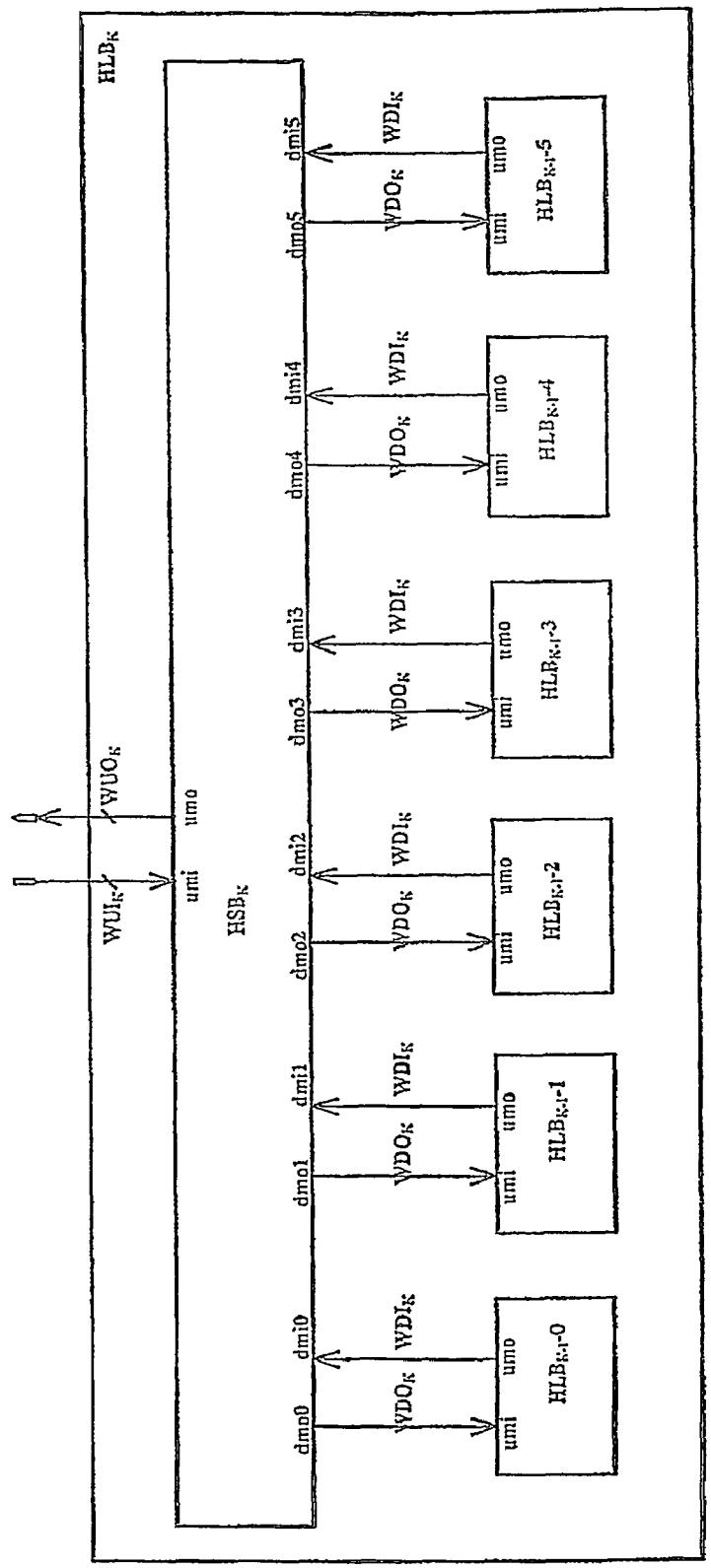
FIG. 4 illustrates block diagram of a parameterized $HLB_k$.

FIG. 4 illustrates block diagram of a parameterized $HLB_k$. Here, k is the hierarchical level number of the HLB, and may be valued as 1, 2, 3 . . . .

Wording "parameterized" means (1) this HLB can be put in any level of hierarchy of k. All HLBs in different level of hierarchy have similar structure, i.e., 1 HSB and a number of children HLBs. (2) All HLB of the same level of hierarchy share the completely same structure, i.e., same children number and same wire width.

As shown in FIG. 4, the $HLB_k$ comprises one $HSB_k$ and six $HLB_{k-1}$s, labeled respectively as $HLB_{k-1}$-0, $HLB_{k-1}$-1, $HLB_{k-1}$-2, $HLB_{k-1}$-3, $HLB_{k-1}$-4, and $HLB_{k-1}$-5. The $HSB_k$ is a multiplexer (MUX), and has an upstream MUX input umi, an upstream MUX output umo, downstream MUX inputs $dmi_0$-$dmi_5$, and downstream MUX outputs $dmo_0$-$dmo_5$. Each $HLB_{k-1}$ has an upstream MUX input umi and an upstream MUX output umo.

The $HSB_k$ receives at umi input signals $WUI_k$ from $HSB_{k+1}$ or external functional block and outputs signals $WUO_k$ at umo to $HSB_{k+1}$ or external functional block. The $HSB_k$ also communicate data with HLBs of level k−1. For example, $HSB_k$ receives at $dmi_0$ input signals $WDI_k$ from $HLB_{k-1}$-0 and outputs signals $WDO_k$ at $dmo_0$ to $HLB_{k-1}$-0.

It should be noted that, although 6 children $HLB_{k-1}$ have been illustrated, it should be applicable to other numbers of children $HLB_{k-1}$.

Figure 5:
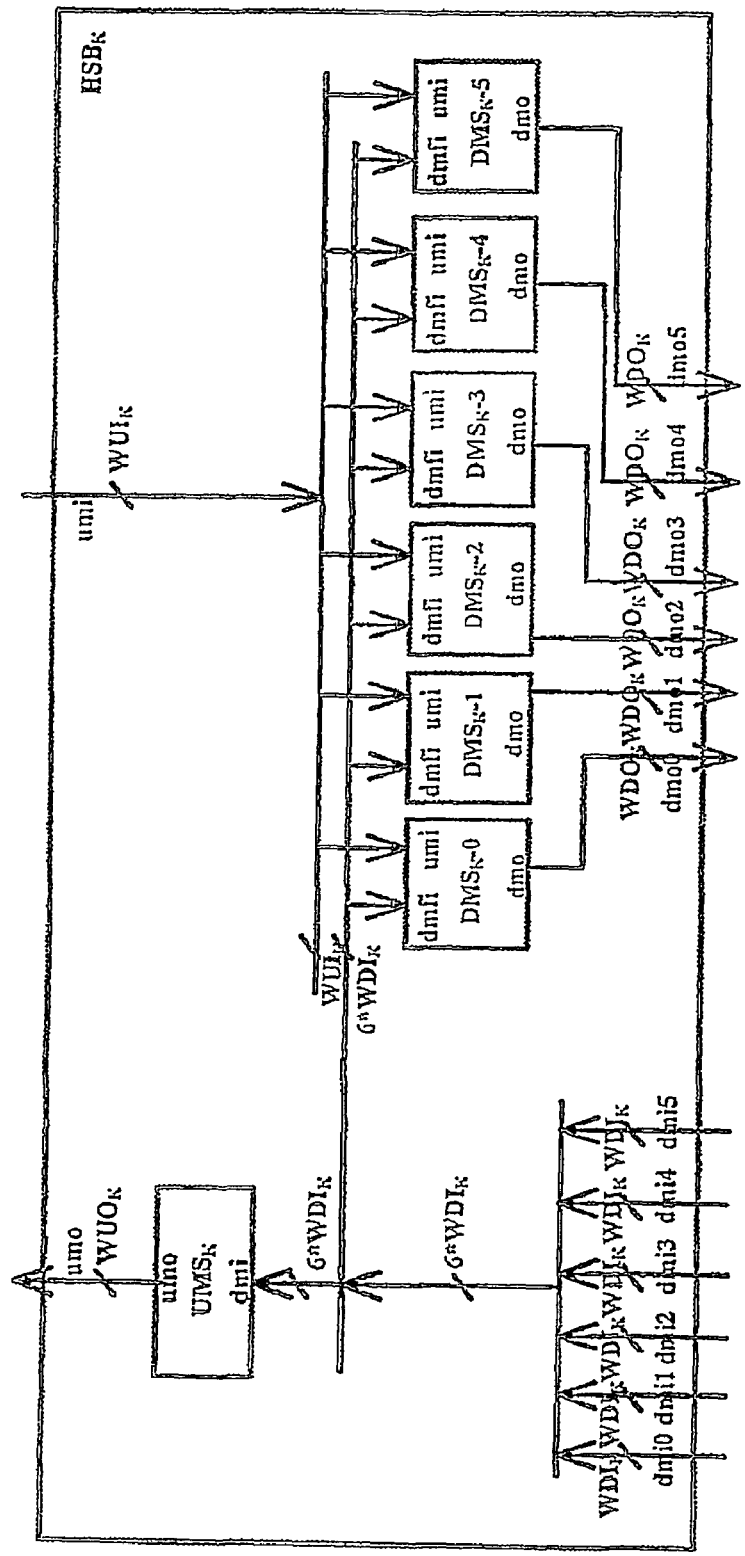
FIG. 5 illustrates a block diagram of the HSB of FIG. 4.

FIG. 5 illustrates a block diagram of the HSB of FIG. 4. The HSB is labeled as $HSB_k$, where k represents hierarchical level of the HSB so that $HSB_k$ may represent any HSB in FIG. 1 and FIG. 2 or HSB of even higher level.

In FIG. 5, $HSB_k$ comprises a plurality of switch cells implemented by multiplexers (MUXs), i.e., upstream MUX switch $UMS_k$, downstream MUX switches $DMS_k$-0, $DMS_k$-1, $DMS_k$-2, $DMS_k$-3, $DMS_k$-4, and $DMS_k$-5. The $HSB_k$ has an upstream MUX input umi, an upstream MUX output umo, downstream MUX inputs $dmi_0$-$dmi_5$, and downstream MUX outputs $dmo_0$-$dmo_5$.

The inputs $dmi_0$-$dmi_5$ will be connected respectively to outputs of six children HLBs, i.e., six LCs connecting to the $HSB_k$ when k=1, or six HSBs of level k−1 connecting to the $HSB_k$ when k is an integer other than 1. The outputs $dmo_0$-$dmo_5$ will be connected to inputs of the six children HLBs, i.e., six LCs connecting to the $HSB_k$ when k=1, or six HSBs of level k−1 connecting to the $HSB_k$ when k is an integer other than 1. The input umi will be connected to output of the parent HSB, i.e., one of the HSBs of level k+1 connecting to the $HSB_k$, or to an external functional block if no parent HSB exists. The output umo will be connected to input of the parent HSB, or to an external functional block if no parent HSB exists.

The $UMS_k$ functions to receive input signals $WDI_k$ from inputs $dmi_0$-$dmi_5$ and, under control of configuration bits, select one of the input signals $WDI_k$ as $WUO_k$ and output it at umo.

The $DMS_k$-j, in which j=0, 1, 2, 3, 4, or 5, has downstream MUX feedback inputs dmfi, upstream MUX input umi and downstream MUX output dmo, and is configured to receive input signals $WDI_k$ from inputs $dmi_j$ and $WUI_k$ from input umi; and, under the control of configuration bits, selects signal from the input signals $WDI_k$ and $WUI_k$ as $WDO_k$ to be the output of respective $dmo_j$.

As discussed above, integrated circuits may be formed by a tree-based hierarchical architecture of HLBs and HSBs according to the present invention. The architecture may be as shown in FIG. 1-3. In this architecture, each HLB may be $HLB_k$ as shown in FIG. 4 and have 4, 6, 8 or any even number of children. To facilitate modeling, the architecture should have a symmetrical structure within same levels of hierarchy, i.e., HLBs in the same level of hierarchy have same number of children. Further, HLBs of at least one level of hierarchy have different number of children from those of other levels of hierarchy. The resulting circuits may have varying sizes.

For example, if the hierarchical architecture is formed by 4 children, 6 children and 8 children, with different number of children in different level of hierarchy, the cell number of the circuit can be represented as follows:

$$l+m+n=t \quad (1)$$

$$\text{Cell Number}=4^l*6^m*8^n \quad (2)$$

In the equations, "t" is total number of levels of hierarchy in the circuit; "l" is number of levels of hierarchy containing 4 children; "m" is number of levels of hierarchy containing 6 children; "n" is the number of levels of hierarchy containing 8 children. "l", "m" and "n" can be any even integer between 0 and "t". Besides, any level between the lowest level of hierarchy and the highest level may be provided with 6 or 8 children, fox example, 4-6-8-4-6 or 6-8-6-4-4.

Table 1 below illustrates how cell numbers change with different children numbers in such a mixed architecture. Note that numbers of children have been chosen as 4, 6 and 8 for illustrative purpose, and only those architectures with 4-6 levels of hierarchy have been listed.

TABLE 1

| Total cell number | increase degree | l (Number of levels with 4 children) | m (Number of levels with 6 children) | n (Number of levels with 8 children) | t (Total number of levels) |
|---|---|---|---|---|---|
| 1024 <= cell number < 4096 | | | | | |
| 1024 | | 5 | 0 | 0 | 5 |
| 1024 | 1 | 2 | 0 | 2 | 4 |
| 1152 | 1.125 | 1 | 2 | 1 | 4 |
| 1296 | 1.265625 | 0 | 4 | 0 | 4 |
| 1536 | 1.5 | 1 | 1 | 2 | 4 |
| 1536 | 1.5 | 4 | 1 | 0 | 5 |
| 1728 | 1.6875 | 0 | 3 | 1 | 4 |
| 2048 | 2 | 4 | 0 | 1 | 5 |
| 2048 | 2 | 1 | 0 | 3 | 4 |
| 2304 | 2.25 | 0 | 2 | 2 | 4 |
| 2304 | 2.25 | 3 | 2 | 0 | 5 |
| 3072 | 3 | 0 | 1 | 3 | 4 |
| 3072 | 3 | 3 | 1 | 1 | 5 |
| 3456 | 3.375 | 2 | 3 | 0 | 5 |
| 4096 <= cell number < 16384 | | | | | |
| 4096 | 1 | 0 | 0 | 4 | 4 |
| 4096 | 1 | 3 | 0 | 2 | 5 |
| 4608 | 1.125 | 2 | 2 | 1 | 5 |
| 5184 | 1.265625 | 1 | 4 | 0 | 5 |
| 6144 | 1.5 | 2 | 1 | 2 | 5 |
| 6144 | 1.5 | 5 | 1 | 0 | 6 |
| 6912 | 1.6875 | 1 | 3 | 1 | 5 |
| 7776 | 1.8984375 | 0 | 5 | 0 | 5 |
| 8192 | 2 | 5 | 0 | 1 | 6 |
| 8192 | 2 | 2 | 0 | 3 | 5 |
| 9216 | 2.25 | 4 | 2 | 0 | 6 |
| 9216 | 2.25 | 1 | 2 | 2 | 5 |
| 10368 | 2.53125 | 0 | 4 | 1 | 5 |
| 12288 | 3 | 4 | 1 | 1 | 6 |
| 12288 | 3 | 1 | 1 | 3 | 5 |
| 13824 | 3.375 | 0 | 3 | 2 | 5 |
| 13824 | 3.375 | 3 | 3 | 0 | 6 |
| 16384 <= cell number < 65536 | | | | | |
| 16384 | 1 | 4 | 0 | 2 | 6 |
| 16384 | 1 | 1 | 0 | 4 | 5 |
| 18432 | 1.125 | 0 | 2 | 3 | 5 |
| 18432 | 1.125 | 3 | 2 | 1 | 6 |
| 20736 | 1.265625 | 2 | 4 | 0 | 6 |
| 24576 | 1.5 | 0 | 1 | 4 | 5 |
| 24576 | 1.5 | 3 | 1 | 2 | 6 |
| 27648 | 1.6875 | 2 | 3 | 1 | 6 |
| 31104 | 1.8984375 | 1 | 5 | 0 | 6 |
| 32768 | 2 | 0 | 0 | 5 | 5 |
| 32768 | 2 | 3 | 0 | 3 | 6 |
| 36864 | 2.25 | 2 | 2 | 2 | 6 |
| 41472 | 2.53125 | 1 | 4 | 1 | 6 |
| 49152 | 3 | 2 | 1 | 3 | 6 |
| 55296 | 3.375 | 1 | 3 | 2 | 6 |
| 62208 | 3.796875 | 0 | 5 | 1 | 6 |

Table 1 contains 6 columns, with the first column representing total cell numbers of the architecture, the second column representing a percentage increase in cell number of present architecture over certain quad-tree architectures, the third-fifth column representing respectively number of levels of hierarchy containing 4, 6, and 8 children, and the sixth column representing total level number of hierarchy.

For better illustration, the table has been marked as 3 parts, the first part being marked with "1024<=cell number<4096" and listing those architectures with cell numbers between 1024 and 4096; the second part being marked with "4096<=cell number<16384" and listing those architectures with cell numbers between 4096 and 16384; and, the third and last part being marked with "16384<=cell number<65536" and listing those architectures with cell numbers between 16384 and 65536.

From the first part of the table, it can be seen that by means of the mixed architecture with different number of children in different level of hierarchy, 14 architectures with cell numbers between 1024 and 4096 may be achieved. As is known, 1024 and 4096 correspond respectively to cell numbers of architecture formed by 5 levels of hierarchy with 4 children in each level, and of architecture formed by 6 levels of hierarchy with 4 children in each level. These 14 architectures offer 8 different cell numbers, including 1152, 1296, 1536, 1728, 2048, 2304, 3072, and 3456, with an increase step of about 12%-25% between contiguous cell numbers. Taking 1152 for example, this architecture is formed by 1 level of 4 children, 2 levels of 6 children, and 1 level of 8 children, its cell number is 12.5% increase over 1024, the cell number of 5-level quad-tree hierarchical architecture. Architecture with cell number of 3456 is formed by 2 levels of 4 children and 3 levels of 6 children, with a 200% increase over 5-level quad-tree hierarchical architecture and a 12.5% increase over the contiguous architecture with cell number of 3072. Compared to an increase of cell number of 300% between contiguous traditional quad-tree architectures, this invention offers greater flexibility for designing integrated circuits with a vast variety of cell numbers and thus chip area could be effectively utilized.

In conclusion, 14 different architectures with varying cell numbers between 1024 and 4096 can be achieved with a mixed architecture of 4, 6 and 8 children in different level of hierarchy.

From the second part of the table, it can be seen that through the mixed architecture with different number of children in different level of hierarchy, 17 different architectures with cell numbers between 4096 and 16384 may be achieved, with an increase step in percentage of about 12.5%-20% between contiguous cell numbers.

From the third part of the table, it can be seen that through the mixed architecture with different number of children in different level of hierarchy, 16 different architectures with cell numbers between 16384 and 65536 may be achieved, with an increase step of cell number in percentage being 12.5%-20% between contiguous cell numbers.

In conclusion, by means of a tree-based hierarchical architecture with different number of children in different level of hierarchy, integrated circuits can be achieved with a vast variety of cell numbers, instead of just power of 4, 6 or 8. Therefore, empty space of chips will be minimized.

Note that, in the above table, some different architectures share the same cell numbers, such as 1536, 2048, 2304 and 3072. For example, architecture with cell number of 3072 may be formed by 1 level of 6 children and 3 levels of 8 children, or, alternatively, by 3 levels of 4 children, 1 level of 6 children, and 1 level of 8 children. The former has one level of hierarchy less than the latter, resulting in a circuit with somewhat larger chip area but less wire numbers in upper levels needed to route logic cells, and thus shorter delay. Further, as mentioned above, the architecture having different children therein may lead to a different layout. For architecture with cell number of 3072, we may have 14 types of implementation, each implantation corresponding to a specific order of the children numbers. Table 2 below shows what kind of layout these 14 types of implementation will bring with.

TABLE 2

| No | Children number* | Total Level number | Approximate Layout length | Approximate Layout Width | Ratio of Length/Width |
|---|---|---|---|---|---|
| 1 | 8-8-8-6 | 4 | 64 | 48 | 1.3 |
| 2 | 8-8-6-8 | 4 | 48 | 64 | 0.75 |
| 3 | 8-6-8-8 | 4 | 64 | 48 | 1.3 |
| 4 | 6-8-8-8 | 4 | 48 | 64 | 0.75 |
| 5 | 8-6-4-4-4 | 5 | 128 | 24 | 5.3 |
| 6 | 8-4-6-4-4 | 5 | 192 | 16 | 12 |
| 7 | 8-4-4-6-4 | 5 | 128 | 24 | 5.3 |
| 8 | 8-4-4-4-6 | 5 | 192 | 16 | 12 |
| 9 | 4-8-6-4-4 | 5 | 96 | 32 | 3 |
| 10 | 4-8-4-6-4 | 5 | 64 | 48 | 1.3 |
| 11 | 4-8-4-4-6 | 5 | 96 | 32 | 3 |
| 12 | 4-4-8-6-4 | 5 | 128 | 24 | 5.3 |
| 13 | 4-4-8-4-6 | 5 | 192 | 16 | 12 |
| 14 | 4-4-4-8-6 | 5 | 96 | 32 | 3 |

*note: numbers from left to right correspond to numbers of children from lower level to high level Table 2 has 6 columns. Column 1 gives an order number for each of the 14 types of implementation. Column 2 shows the numbers of children in each level of hierarchy for each of the 14 types of implementation. It is to be noted that, in this column, the first number to the left corresponds to number of children in lowest level, and the last number corresponds to number of children in the highest level. Columns 3-6 show respectively total level number, approximate layout length, approximate layout width, and ratio of length/width for each implementation.

Figure 6:
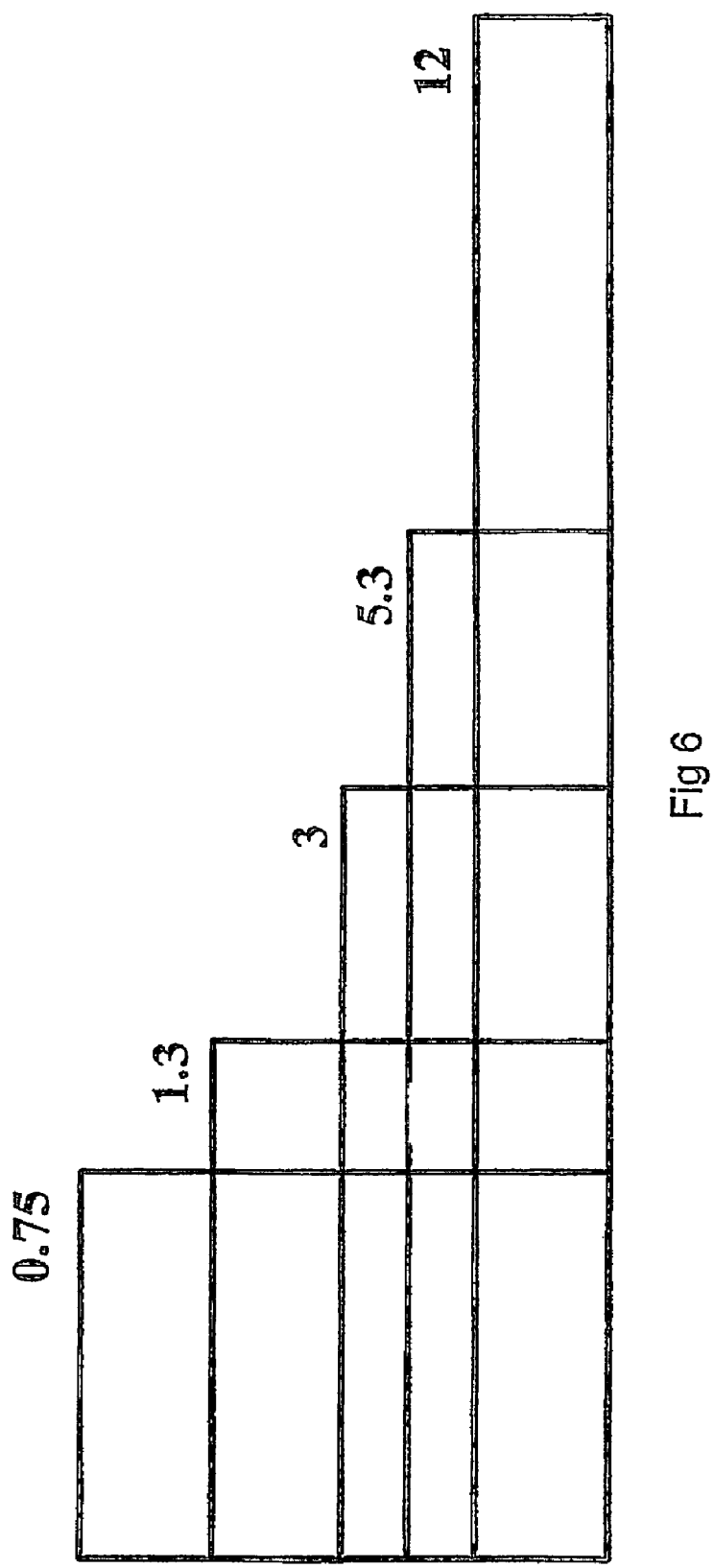
FIG. 6 illustrates different shapes of layout with the same cell number of 3072.

From Table 2, it is noted that with the same cell number of 3072, 5 different shapes (ratio being 0.75, 1.3, 3, 5.3, and 12) may be achieved by arranging the different children in different level(s). FIG. 6 illustrates the 5 different shapes. From FIG. 6, we note that the shapes changes from roughly square to rectangle, and further to slender. It should be noted that, although most of the shapes are in left-right direction, they may be altered to up-down direction if the direction of the layout is rotated 90°.

That is to say, by choice of numbers of LCs and HLBs in levels of hierarchy and careful layout of these LCs and HLBs in different directions, the shape of resulting integrated circuits may change from square to rectangle. In other words, level(s) of hierarchy may be chosen to place the different number of children therein so as to meet layout requirement of the circuit. This offers greater flexibility for layout of integrated circuits in one chip.

In addition, since a number of applications use only a small amount of logic cells, it is preferable that number of children will be larger in lower levels of hierarchy than in upper levels so that logic cells for implementing these applications may be located in one or several blocks of lower level of hierarchy. In this case, more wires for connection may be placed in neighborhood of the logic cells, and less wire of upper levels involved, leading to shorter connections, and thus lower delay and faster speed.

Figure 7:
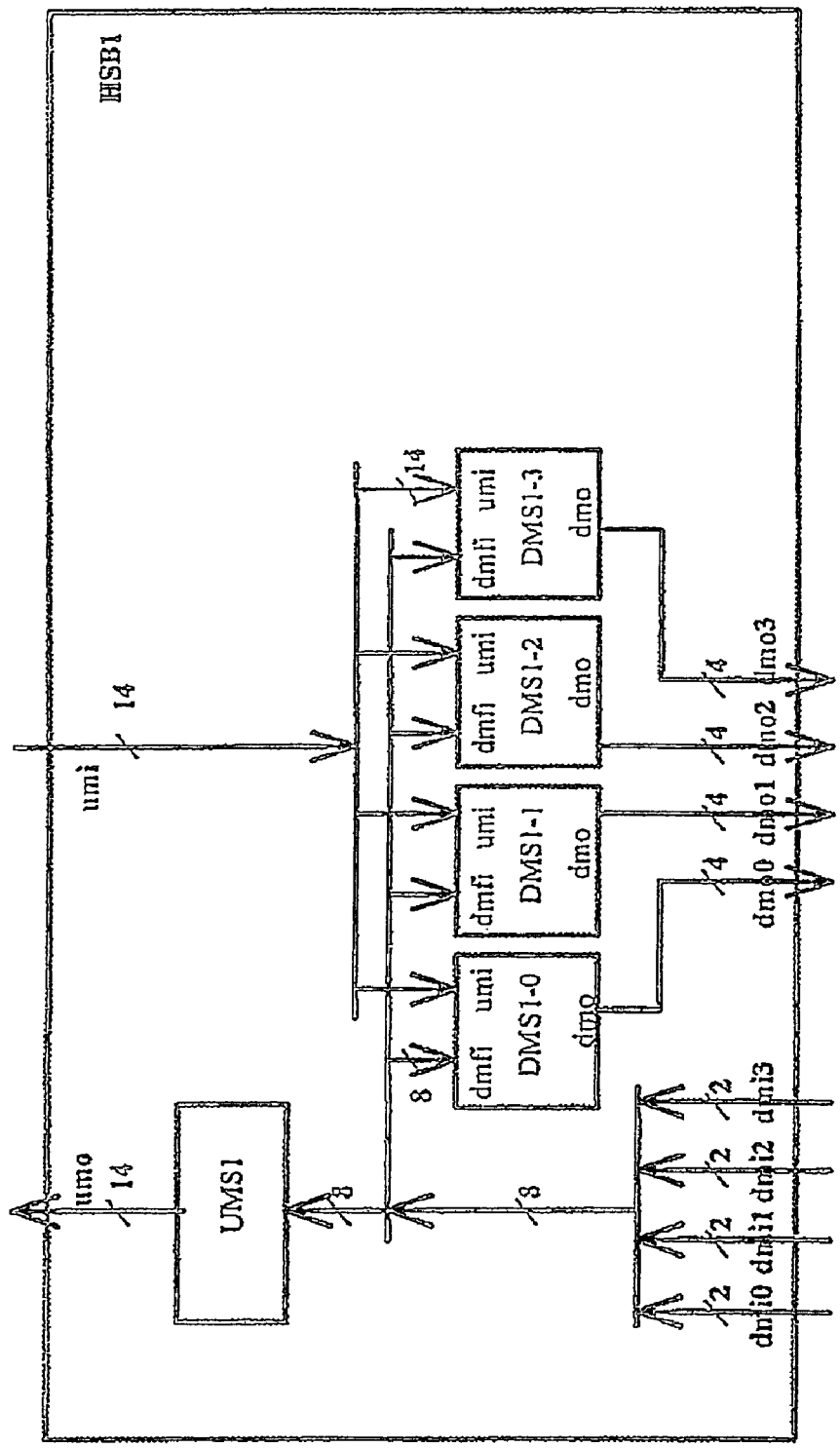
FIG. 7 illustrates wire routing within a HSB1 for connecting to 4 children logic cells.
Figure 8:
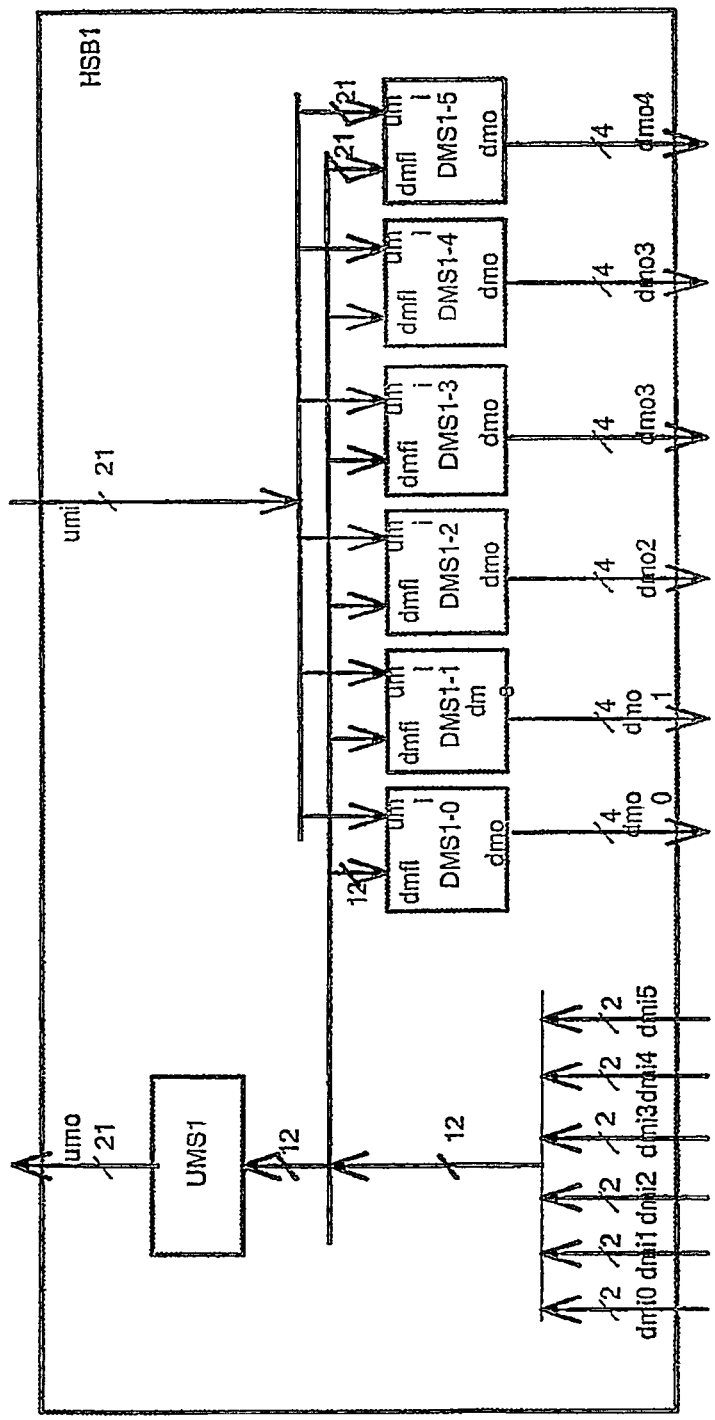
FIG. 8 illustrates wire routing within a HSB1 for connecting to 6 children logic cells.

FIG. 7 illustrates wire routing within a HSB1 for connecting to 4 children. FIG. 8 illustrates wire routing within a HSB1 for connecting to 6 children. Comparing FIG. 7 with FIG. 8, it will be found that the HSB1 with 4 children have 14 input/output wires to upper level HSB2, and the HSB1 with 6 children have 21 input/output wires to upper level HSB2. That is to say, HSBs with different children number will have different input and output wire widths, and also different number of multiplexers, which will lead to different chip size and affect timing seriously. Different children number may lead to variation of wire length and wire number needed to route logic cells, and thus a circuit with different size and timing. Currently the scale of integrated circuits tends to expand, and more and more wires have to be used in upper levels of hierarchy to make interconnections, which seriously affect the timing. Having more children in lower levels of hierarchy will ease such a pressure. It should be noted that the switch boxes as mentioned above may be implemented by pass transistors, pass gates, multiplexers or other elements that can execute logical selection and connectivity functions. The multiplexers (MUXs) are preferred since they need less space to store configuration bits compared to other switch boxes.

This invention is also applicable to so-called System-on-a-Chip (SOC), where the connections between the processors, memories, and peripheral elements of an integrated circuit can be changed depending on the demands of the program that is running.

While there has been described in connection with the preferred embodiments of the invention, it will be obvious to those skilled in the art that various changes and modifications may be made therein without departing from the invention, and it is aimed, therefore, to cover in the appended claims all such changes and modifications as fall within the true spirit and scope of the invention, which is defined by the metes and bounds of the appended claims.

What is claimed is:

1. An integrated circuit, comprising:
an array of components and a programmable interconnect network for the array of components, said programmable interconnect network comprising a plurality of switch boxes being connected in a tree-based hierarchical architecture and providing selection and connection for the components responsive to configuration bits;
wherein the switch boxes of the plurality of switch boxes that are located at the lowest level of the tree structure are connected to the components; and
wherein the switch boxes of the plurality of switch boxes in at least one level of hierarchy have a different number of children from those in other levels of hierarchy; and
wherein a number of children switch boxes of at least one level of the hierarchy is determined based on a specification of a total number of components or a dimension of the integrated circuit.

2. The integrated circuit as claimed in claim 1, wherein said plurality of switch boxes comprise multiplexers, pass transistors, or pass gates.

3. The integrated circuit as claimed in claim 1, wherein each of said plurality of switch boxes comprises a plurality of first switch cells (DMS), each of which functions to receive a signal from parent switch box and pass it to children switch box or component.

4. The integrated circuit as claimed in claim 1, wherein each of said plurality of switch boxes comprises a plurality of second switch cells (DMS), each of which functions to receive signals from children switch boxes or components and select one as output to another children switch box or component.

5. The integrated circuit as claimed in claim 1, wherein each of said plurality of switch boxes comprises a third switch cell (UMS), which functions to select signals from children switch box or component and send the selected one to parent switch box.

6. The integrated circuit as claimed in claim 1, wherein children number is chosen from the group including 4, 6 and 8.

7. The integrated circuit as claimed in claim 1, wherein said integrated circuit comprises an FPGA, and said component is logic cell.

8. The integrated circuit as claimed in claim 1, wherein said integrated circuit comprises a SOC.

9. The integrated circuit as claimed in claim 1, wherein switch boxes of lower levels of hierarchy have more children than those upper levels of hierarchy.

10. The integrated circuit as claimed in claim 1, wherein in case that there are two or more architectures including equal number of logic cells, an architecture with less number of level of hierarchy is formed.

11. The integrated circuit as claimed in claim 1, wherein one or more levels of the hierarchy are chosen to place the different number of children therein so as to meet layout requirement of the circuit.

12. The integrated circuit as claimed in claim 1, wherein the number of children switch boxes of the at least one level of the hierarchy is determined based on the specification so as to reduce empty space of the integrated circuit or to allow flexibility in arranging the components.

* * * * *